(12) United States Patent
Bae et al.

(10) Patent No.: US 10,283,736 B2
(45) Date of Patent: May 7, 2019

(54) DISPLAY APPARATUS AND PORTABLE TERMINAL

(71) Applicant: SAMSUNG DISPLAY CO., LTD., Yongin-si, Gyeonggi-do (KR)

(72) Inventors: Kyuhan Bae, Yongin-si (KR); Jeungsoo Kim, Yongin-si (KR); Eunju Shin, Yongin-si (KR); Jeongseok Oh, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/638,735

(22) Filed: Jun. 30, 2017

(65) Prior Publication Data

US 2017/0301878 A1 Oct. 19, 2017

Related U.S. Application Data

(63) Continuation of application No. 14/887,887, filed on Oct. 20, 2015, now Pat. No. 9,699,943.

(30) Foreign Application Priority Data

Mar. 10, 2015 (KR) ........................ 10-2015-0033344

(51) Int. Cl.
  *G06F 1/16* (2006.01)
  *H05K 1/02* (2006.01)
  (Continued)

(52) U.S. Cl.
  CPC ...... *H01L 51/529* (2013.01); *G02F 1/133308* (2013.01); *G06F 1/1637* (2013.01);
  (Continued)

(58) Field of Classification Search
  CPC ..... G06F 1/181–1/182; G06F 1/1601–1/1611; G06F 1/1613–1/1698;
  (Continued)

(56) References Cited

U.S. PATENT DOCUMENTS

2005/0046618 A1 3/2005 Kim et al.
2005/0077822 A1 4/2005 Kim et al.
(Continued)

FOREIGN PATENT DOCUMENTS

CN 1591745 A 3/2005
CN 103415878 A 11/2013
(Continued)

OTHER PUBLICATIONS

European Office Action dated Jul. 20, 2016.
Chinese Office Action dated Mar. 15, 2019.

*Primary Examiner* — Anthony M Haughton
*Assistant Examiner* — Razmeen Gafur
(74) *Attorney, Agent, or Firm* — Lee & Morse, P.C.

(57) ABSTRACT

A display apparatus includes a display panel including a display surface that displays an image and a rear surface that faces the display surface, a cover panel attached to the rear surface of the display panel, the cover panel including a center portion and an edge portion surrounding the center portion, the center portion having a thickness greater than a thickness of the edge portion, and a reinforcing member in an overlapping relationship with the edge portion of the cover panel, the reinforcing member facing the display panel such that the cover panel is between the reinforcing member and the display panel.

22 Claims, 7 Drawing Sheets

(51) Int. Cl.
| | |
|---|---|
| *H05K 1/18* | (2006.01) |
| *H05K 5/00* | (2006.01) |
| *H05K 7/20* | (2006.01) |
| *H01L 51/00* | (2006.01) |
| *H01L 51/52* | (2006.01) |
| *G02F 1/1333* | (2006.01) |
| *G06F 1/20* | (2006.01) |

(52) U.S. Cl.
CPC ............ G06F 1/20 (2013.01); H01L 51/0096 (2013.01); H01L 51/524 (2013.01); H01L 51/5284 (2013.01); H05K 1/028 (2013.01); H05K 1/0274 (2013.01); H05K 1/181 (2013.01); H05K 5/0017 (2013.01); H05K 7/20963 (2013.01); *G02F 1/133385* (2013.01); *G02F 2001/133311* (2013.01); *G02F 2201/503* (2013.01); *H05K 2201/10106* (2013.01)

(58) Field of Classification Search
CPC .. G06F 1/18–1/189; H05K 5/00–5/069; H05K 7/00–7/186; H05K 7/20218–7/20381; H05K 7/20409–7/20418; H05K 7/20009–7/202; H01L 23/367–23/3677; H01L 23/473; H01L 23/46–23/467
USPC ............. 361/679.01–679.45, 679.55–679.61, 361/679.26–679.3, 679.31–679.39, 756, 361/741, 686, 687, 787, 789, 794, 361/807–810, 676–678, 679.46–679.54, 361/688–727; 335/214, 219, 225, 335/228–230, 234, 250, 262, 274, 275, 335/285, 296, 302–306; 455/575.1–575.9; 349/56–60; 312/223.1–223.3; 348/787, 789, 794
See application file for complete search history.

(56) References Cited

U.S. PATENT DOCUMENTS

| | | | |
|---|---|---|---|
| 2005/0105259 A1 | 5/2005 | Lee et al. | |
| 2006/0077629 A1 | 4/2006 | Shiraishi | |
| 2006/0114663 A1* | 6/2006 | Kim | H05K 5/02 361/807 |
| 2006/0232915 A1 | 10/2006 | Chou et al. | |
| 2006/0268510 A1* | 11/2006 | Jeong | H05K 7/20963 361/689 |
| 2007/0004253 A1 | 1/2007 | Lee et al. | |
| 2007/0076384 A1 | 4/2007 | Shin | |
| 2007/0138485 A1 | 7/2007 | Meng et al. | |
| 2007/0258199 A1 | 11/2007 | Jeong | |
| 2008/0297998 A1 | 12/2008 | Choi | |
| 2008/0298003 A1 | 12/2008 | Pyo | |
| 2009/0058235 A1 | 3/2009 | Uchimi | |
| 2009/0185341 A1 | 7/2009 | Jang et al. | |
| 2009/0279015 A1 | 11/2009 | Lee et al. | |
| 2010/0259881 A1 | 10/2010 | Choi et al. | |
| 2010/0309102 A1 | 12/2010 | Jung | |
| 2011/0069055 A1 | 3/2011 | Jung et al. | |
| 2011/0134057 A1* | 6/2011 | Kubo | G02F 1/1306 345/173 |
| 2011/0170254 A1* | 7/2011 | Chuang | G06F 1/1637 361/679.27 |
| 2011/0182017 A1 | 7/2011 | Kang et al. | |
| 2011/0209376 A1 | 9/2011 | Kinno | |
| 2011/0221980 A1 | 9/2011 | Kawabata et al. | |
| 2011/0310545 A1* | 12/2011 | Liu | G02F 1/133308 361/679.01 |
| 2012/0045081 A1* | 2/2012 | Mittleman | H04M 1/035 381/334 |
| 2012/0045086 A1* | 2/2012 | Su | G06F 1/1643 381/388 |
| 2012/0200767 A1 | 8/2012 | Park et al. | |
| 2012/0212890 A1* | 8/2012 | Hoshino | H04M 1/0202 361/679.01 |
| 2012/0293960 A1* | 11/2012 | Takashima | G02F 1/133308 361/707 |
| 2012/0314376 A1 | 12/2012 | Mukaide et al. | |
| 2013/0010409 A1* | 1/2013 | Jhan | G06F 1/32 361/679.01 |
| 2013/0010413 A1* | 1/2013 | Kim | G09F 9/33 361/679.01 |
| 2013/0027857 A1* | 1/2013 | Jeong | G02F 1/133308 361/679.01 |
| 2013/0058018 A1* | 3/2013 | Song | G06F 1/1626 361/679.01 |
| 2013/0070399 A1 | 3/2013 | Liu et al. | |
| 2013/0135794 A1* | 5/2013 | Wang | H04M 1/026 361/679.01 |
| 2013/0182379 A1* | 7/2013 | Kim | H04M 1/0283 361/679.01 |
| 2013/0186678 A1 | 7/2013 | Koike et al. | |
| 2013/0201170 A1 | 8/2013 | Matsui | |
| 2013/0271896 A1* | 10/2013 | Hu | G02F 1/133308 361/679.01 |
| 2013/0308255 A1 | 11/2013 | Sasaki et al. | |
| 2014/0118915 A1* | 5/2014 | Dukker | G06F 1/1681 361/679.09 |
| 2014/0177147 A1* | 6/2014 | Teramoto | H05K 13/00 361/679.01 |
| 2014/0313746 A1* | 10/2014 | Song | G06F 1/1637 362/362 |
| 2014/0340824 A1* | 11/2014 | Chen | H04M 1/0266 361/679.3 |
| 2014/0347816 A1 | 11/2014 | Ogura | |
| 2014/0355194 A1* | 12/2014 | Shiraishi | H04M 1/0249 361/679.26 |
| 2014/0355195 A1* | 12/2014 | Kee | G06F 1/1616 361/679.27 |
| 2015/0008404 A1 | 1/2015 | Oh et al. | |
| 2015/0177453 A1* | 6/2015 | Ikuta | G02B 6/0073 348/794 |
| 2016/0033996 A1* | 2/2016 | Lee | G06F 1/1626 361/679.26 |
| 2016/0034002 A1* | 2/2016 | Yang | G06F 1/1656 361/679.03 |

FOREIGN PATENT DOCUMENTS

| | | |
|---|---|---|
| KR | 2009-0080009 A | 7/2009 |
| KR | 10-2010-0009913 A | 1/2010 |
| KR | 10-2012-0058206 A | 6/2012 |
| KR | 10-2013-0009564 A | 1/2013 |
| KR | 10-2013-0025769 A | 3/2013 |
| WO | WO 2011/102152 A1 | 8/2011 |

* cited by examiner

DISPLAY APPARATUS AND PORTABLE TERMINAL

CROSS-REFERENCE TO RELATED APPLICATIONS

This is a continuation application based on pending application Ser. No. 14/887,887, filed Oct. 20, 2015, the entire contents of which is hereby incorporated by reference.

Korean Patent Application No. 10-2015-0033344, filed on Mar. 10, 2015, in the Korean Intellectual Property Office, and entitled: "Display Apparatus and Portable Terminal," is incorporated by reference herein in its entirety.

BACKGROUND

1. Field

Embodiments relate to a display apparatus and a portable terminal.

2. Description of the Related Art

In recent years, a portable terminal has been widely used. The portable terminal includes a display panel displaying an image and a window member. The window member determines an appearance of the portable terminal. As the display panel, a liquid crystal display panel or an organic light emitting display panel is used. The organic light emitting display panel is employed for a small-size portable electronic device because the organic light emitting display panel has advantages such as thin thickness, high flexibility, etc., compared to the liquid crystal display panel.

SUMMARY

Embodiments are directed to a display apparatus including a display panel including a display surface that displays an image and a rear surface that faces the display surface, a cover panel attached to the rear surface of the display panel, the cover panel including a center portion and an edge portion surrounding the center portion, the center portion having a thickness greater than a thickness of the edge portion, and a reinforcing member in an overlapping relationship with the edge portion of the cover panel, the reinforcing member facing the display panel such that the cover panel is between the reinforcing member and the display panel.

The cover panel may include a heat discharge member that faces the display surface of the display panel such that the rear surface of the display panel is between the heat discharge member and the display surface, and an emission member that faces the display panel such that the heat discharge member is between the display panel and the emission member, the emission member exposing an edge area of the heat discharge member when viewed in a plan view.

The reinforcing member may be on a same layer as the emission member and may cover a portion of the edge area of the heat discharge member.

The emission member may have a first thickness and the reinforcing member may have a second thickness smaller than the first thickness.

The display apparatus may further include a bracket coupled to the emission member.

The reinforcing member may not be adhered to the bracket.

The reinforcing member may be spaced apart from the bracket.

The heat discharge member may have a substantially quadrangular shape. The edge area of the heat discharge member may include first, second, third, and fourth edge areas extending respectively along four sides of the heat discharge member. The reinforcing member may be in an overlapping relationship with three edge areas of the first to fourth edge areas.

The reinforcing member may include a first reinforcing member in an overlapping relationship with the first edge area, a second reinforcing member in an overlapping relationship with the second edge area, and a third reinforcing member in an overlapping relationship with the third edge area, the first, second, and third reinforcing members being integrally formed with each other.

The cover panel may further include a light blocking member attached to the rear surface of the display panel, and a buffering member between the light blocking member and the heat discharge member.

The heat discharge member may include a graphite layer, a heat discharge adhesive layer between the buffering member and the graphite layer, the heat discharge adhesive layer attaching the buffering member to the graphite layer, a protective layer that faces the heat discharge adhesive layer such that the graphite layer is between the heat discharge adhesive layer and the protective layer, and a blocking layer surrounding the heat discharge adhesive layer, the graphite layer, and the protective layer when viewed in a plan view, the blocking layer sealing the graphite layer in cooperation with the heat discharge adhesive layer and the protective layer.

The emission member may be in an overlapping relationship with the graphite layer and may not be in an overlapping relationship with the blocking layer.

A width of the emission member may be substantially the same as a width of the graphite layer.

The emission member may be in an overlapping relationship with a portion of the graphite layer and the blocking layer.

A width of the emission member may be greater than a width of the graphite layer.

The emission member may include a conductive sheet, a first emission adhesive layer between the heat discharge member and the conductive sheet, the first emission adhesive layer attaching the heat discharge member to the conductive sheet, and a second emission adhesive layer between the conductive sheet and the bracket, the second emission adhesive layer attaching the conductive sheet to the bracket.

The reinforcing member may have a same thickness as the emission member.

The reinforcing member may include polyethylene terephthalate.

The display panel may include a substrate, an organic light emitting diode on the substrate, a sealing layer on the substrate, the sealing layer covering the organic light emitting diode, and a sealing member that attaches the substrate to the sealing layer and that seals the organic light emitting diode in cooperation with the substrate and the sealing layer, the reinforcing member covering the sealing member when viewed in a plan view.

Embodiments are also directed to a portable terminal including a display panel including a display surface that displays an image and a rear surface that faces the display surface, a heat discharge member that faces the display surface of the display panel such that the rear surface of the display panel is between the heat discharge member and the display surface of the display panel, an emission member that faces the display panel such that the heat discharge member is between the emission member and the display panel, the emission member exposing an edge area of the heat discharge member when viewed in a plan view, a reinforcing member on a same layer as the emission member, the reinforcing member covering a portion of the edge area of the heat discharge member, and a bracket coupled to the emission member.

The reinforcing member may not be adhered to the bracket.

The emission member may have a first thickness and the reinforcing member has a second thickness smaller than the first thickness.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
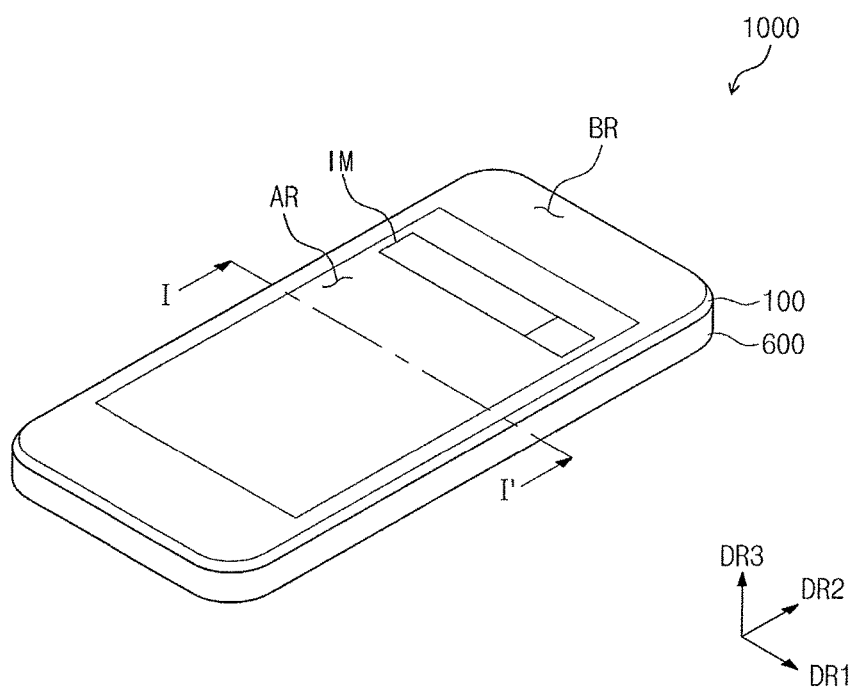
FIG. 1 illustrates a perspective view showing a display apparatus according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when an element is referred to as being "on" another element, it can be directly on the other element, or intervening elements may also be present. Further, it will be understood that when a layer is referred to as being "between" two elements, it can be the only element between the two elements, or one or more intervening elements may also be present. Like reference numerals refer to like elements throughout.

Figure 2:
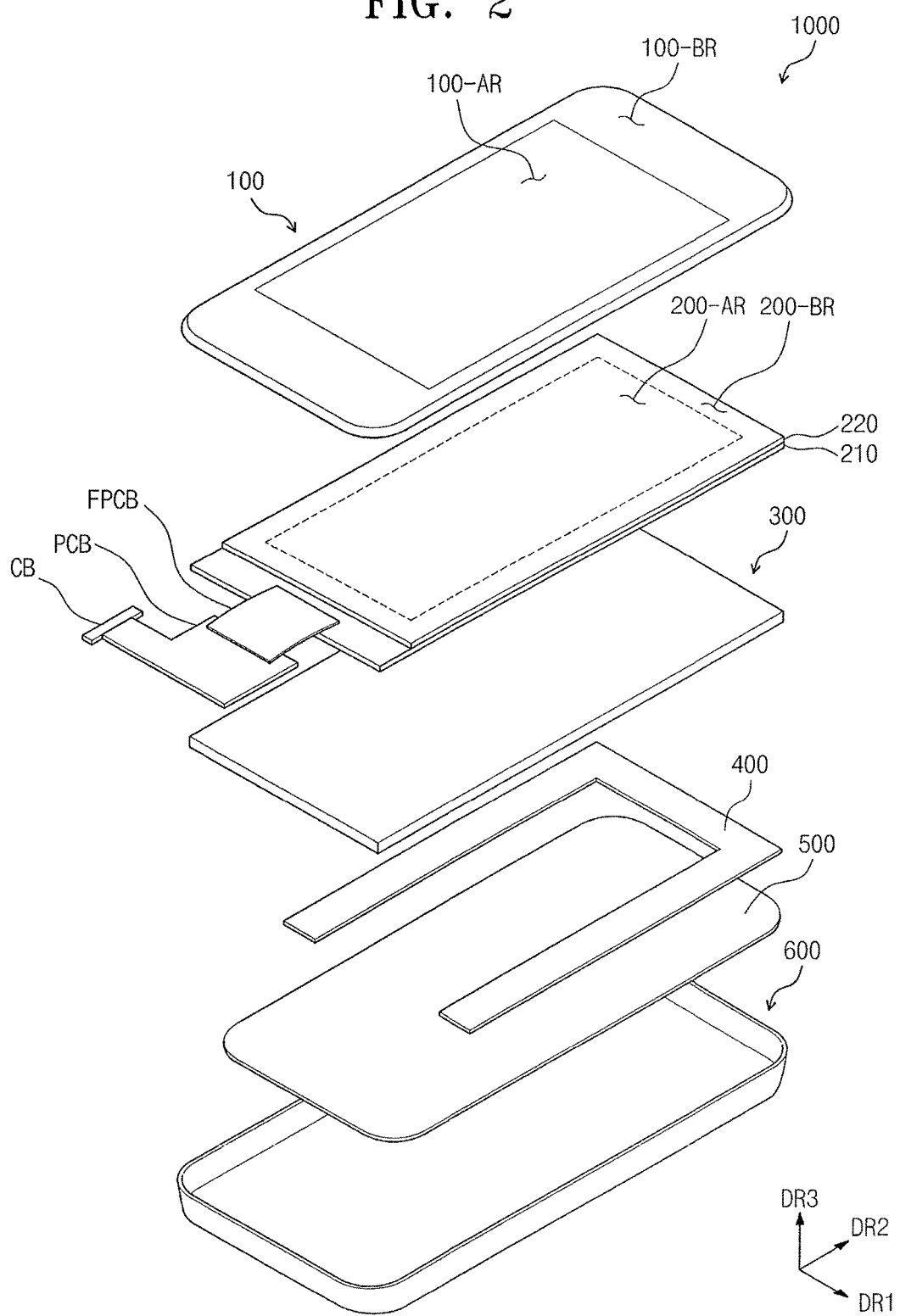
FIG. 2 illustrates an exploded perspective showing the display apparatus shown in FIG. 1.
Figure 3:
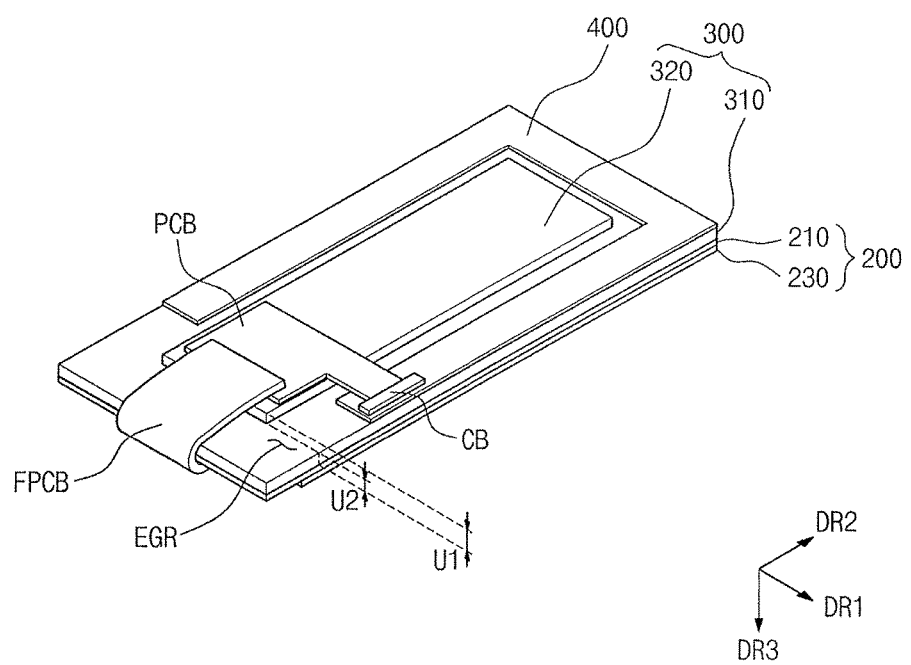
FIG. 3 illustrates a rear perspective view showing a display panel coupled to a cover panel.

FIG. 1 illustrates a perspective view showing a display apparatus 1000 according to an exemplary embodiment, FIG. 2 illustrates an exploded perspective showing the display apparatus shown in FIG. 1, and FIG. 3 illustrates a rear perspective view showing a display panel coupled to a cover panel.

FIG. 1 shows a portable terminal to which the display apparatus 1000 according to an exemplary embodiment is applied. The portable terminal may include a tablet PC, a personal digital assistant (PDA), a portable multimedia player (PMP), a game unit, a wrist-type electronic device, etc., as examples. The display apparatus may also be applied to a large-sized electronic item, such as a television set, an outdoor billboard, etc., and a small and medium-sized electronic item, such as a personal computer, a notebook computer, a car navigation unit, a camera, a cell phone, etc., as examples.

As shown in FIG. 1, the display apparatus 1000 may include a plurality of areas defined on a display surface. The display apparatus 1000 may include a display area AR through which an image IM is displayed and a non-display area BR disposed adjacent to the display areas AR. FIG. 1 depicts an internet search window as a representative example. The display area AR may have a substantially quadrangular shape. The non-display area BR may surround the display area AR.

Referring to FIGS. 1 to 3, the display apparatus 1000 may include a window member 100, a display panel 200, a cover panel 300, a reinforcing member 400, a bracket 500, and a rear case 600.

The window member 100 may include a display area 100-AR transmitting the image IM provided from the display panel 200 and a non-display area 100-BR disposed adjacent to the display area 100-AR. The window member 100 may be disposed above the display panel 200. The window member 100 may include a cover window formed of glass, sapphire, or plastic.

The display panel 200 may include a display area 200-AR and a non-display area 200-BR. The display area 200-AR may display the image IM and may correspond to the display area 100-AR of the window member 100. The non-display area 200-BR may be disposed adjacent to the display area 200-AR and may correspond to the non-display area 100-BR of the window member 100.

The display panel 200 may be, for example, an organic light emitting display panel. The display panel 200 includes a substrate 210, an organic light emitting diode 220 (see FIGS. 4, 6, and 7), and a sealing layer 230. The organic light emitting diode 220 may be disposed on the substrate 210. The sealing layer 230 may be disposed on the substrate 210 and may seal the organic light emitting diode 220 from the outside environment.

The display panel 200 may include a display surface on which the image IM is displayed and a rear surface opposite to the display surface. In FIG. 2, the display surface may correspond to an upper surface of the sealing layer 230 and the rear surface may correspond to a lower surface of the substrate 210.

The display surface, on which the image IM is displayed, may be substantially parallel to a surface defined by a first direction DR1 and a second direction DR2. A normal line direction of the display surface may be referred to as a third direction DR3. The third direction DR3 may serve as a reference direction, for example, to divide a front surface and a rear surface of each member.

The display apparatus 1000 may further include a flexible printed circuit board FPCB and a printed circuit board PCB.

The flexible printed circuit board FPCB may electrically connect the display panel 200 and the printed circuit board PCB. One end of the flexible printed circuit board FPCB may be connected to one surface of the substrate 210 that is exposed by the sealing layer 230, and the other end of the flexible printed circuit board FPCB may be connected to the printed circuit board PCB. The flexible printed circuit board FPCB may have flexibility. Thus, the flexible printed circuit board FPCB may be bent to a lower side of the cover panel 300 while being coupled to the printed circuit board PCB.

The printed circuit board PCB may apply a signal to or receive a signal from the display panel 200 through the flexible printed circuit board FPCB. The printed circuit board PCB may be attached to the lower side of the cover panel 300 due to the bending of the flexible printed circuit board FPCB. The printed circuit board PCB may be connected to a connector CB to receive a signal from an external source.

The display apparatus 1000 may further include a touch panel. The touch panel may be disposed between the window member 100 and the display panel 200. In some implementations, the touch panel may be disposed inside of the display panel 200. The touch panel may be a resistive type touch panel, an electrostatic capacitive type touch panel, or an electromagnetic induction type touch panel. The touch panel may secure coordinate information with respect to a position at which a touch event occurs.

The cover panel 300 may be attached to the rear surface of the display panel 200. The cover panel 300 may be disposed between the display panel 200 and the printed circuit board PCB when the cover panel 300 and the printed circuit board PCB are coupled to each other.

The cover panel 300 may include a heat discharge member 310 and an emission member 320. The cover panel 300 may include a center portion and an edge portion surrounding the center portion. The center portion of the cover panel 300 may include the emission member 320 and a portion of the heat discharge member 310, which is overlapped with the emission member 320. The edge portion of cover panel 300 may include the other portion of the heat discharge member 310, the other portion of the heat discharge member 310 not being overlapped with the emission member 320. A thickness in the third direction DR3 of the center portion of the cover panel 300 may be greater than a thickness in the third direction DR3 of the edge portion of the cover panel 300. The thickness U1 of the center portion of the cover panel 300 may be substantially equal to a sum of a thickness of the heat discharge member 310 and a thickness of the emission member 320. The thickness U2 of the edge portion of the cover panel 300 may be substantially equal to the thickness of the heat discharge member 310.

The heat discharge member 310 may be disposed to face the sealing layer 230 such that the substrate 210 is disposed between the heat discharge member 310 and the sealing layer 230. The heat discharge member 310 may be disposed between the display panel 200 and the emission member 320. The heat discharge member 310 may effectively discharge heat generated from the display panel 200.

The emission member 320 may be disposed on and attached to the heat discharge member 310. The emission member 320 may block electro-magnetic interference (EMI) generated from the printed circuit board PCB. In addition, the emission member 320, together with the heat discharge member 310, may discharge heat generated from the display panel 200.

The emission member 320 may have an area smaller than that of the heat discharge member 310 when viewed in a plan view. The edge portion of the heat discharge member 310 may be exposed and not be covered by the emission member 320. The cover panel 300 will be described in detail below.

The reinforcing member 400 may be disposed on the same layer as the emission member 320. The reinforcing member 400 may be attached to the heat discharge member 310. The reinforcing member 400 may cover a portion of an edge area EGR of the heat discharge member 310. The reinforcing member 400 may relieve impacts applied to the display panel 200 in the event that external impacts are applied to the display apparatus 1000. The reinforcing member 400 will be described in detail below.

The bracket 500 supports the display panel 200 and the cover panel 300. One surface of the bracket 500 may be attached to the cover panel 300 and electronic components may be mounted on the other surface of the bracket 500.

The rear case 600 may be coupled to the window member 100 to accommodate the display panel 200 and the cover panel 300. The rear case 600 may include a plastic or metallic material. In some implementations, the rear case 600 may be omitted.

Figure 4:
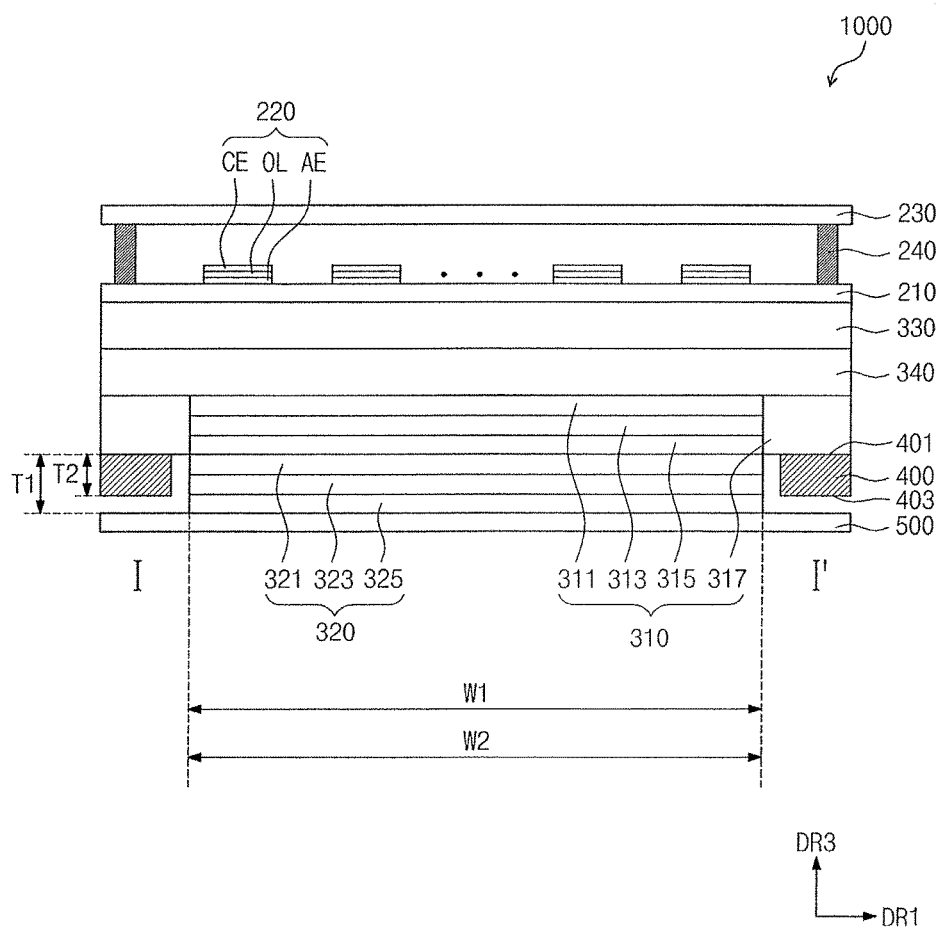
FIG. 4 illustrates a cross-sectional view taken along a line I-I' of FIG. 1.

FIG. 4 illustrates a cross-sectional view taken along a line I-I' of FIG. 1. For the convenience of explanation, the window member 100 and the rear case 600 are not illustrated in FIG. 4.

Referring to FIGS. 2 to 4, the organic light emitting diode 220 may be disposed on the substrate 210. The organic light emitting diode 220 may be disposed in each pixel of the display panel 200. The organic light emitting diode 220 may include a first electrode AE, an organic light emitting layer OL, and a second electrode CE. The first electrode AE may be an anode electrode or a positive electrode. The second electrode CE may be a cathode electrode or a negative electrode. The first electrode AE may generate holes and the second electrode CE may generate electrons. The holes generated by the first electrode AE and electrons generated by the second electrode CE may be injected into the organic light emitting layer OL. The holes and electrons injected into the organic light emitting layer OL may recombine in the organic light emitting layer OL to generate excitons, and light may be emitted by the excitons that return to a ground state from an excited state.

The display panel 200 may further include a driving layer disposed between the first electrode AE and the substrate 210. The driving layer may include a transistor applying a driving voltage to the first electrode AE and gate and data lines connected to the transistor.

The display panel 200 may further include a sealing member 240 disposed between the substrate 210 and the sealing layer 230. The sealing member 240 disposed between the substrate 210 and the sealing member 240 may attach the substrate 210 to the sealing member 240. The sealing member 240 may be disposed along an edge of the display panel 200 when viewed in a plan view. The sealing member 240, in cooperation with the substrate 210 and the sealing layer 230, may prevent external moisture and air from flowing into the organic light emitting diode 220.

The cover panel 300 may further include a light blocking member 330 and a buffering member 340.

The light blocking member 330 may be attached to the rear surface of the display panel 200 to block the light incident to the display panel 200. The light blocking member 330 may absorb or reflect the light incident thereto.

The buffering member 340 may be disposed between the light blocking member 330 and the heat discharge member 310. The buffering member 340 may disperse the impact applied to the display panel 200 and the window member 100. The buffering member 340 may absorb a portion of the impact applied to the display panel 200 and the window member 100, and may prevent damage to the display panel 200 and the window member 100. The buffering member 340 may be formed of a polymer resin, e.g., polyurethane, polycarbonate, polypropylene, polyethylene, etc., or may be formed from a rubber solution, a urethane-based material, or a sponge obtained by foaming/molding an acrylic-based material, as examples.

The heat discharge member 310 may include a heat discharge adhesive layer 311, a graphite layer 313, a protective layer 315, and a blocking layer 317.

The heat discharge adhesive layer 311 may be disposed between the buffering member 340 and the graphite layer 313 to attach the buffering member 340 to the graphite layer 313. The heat discharge adhesive layer 311 may include an optical clear adhesive (OCA) or an optical clear resin (OCR).

The graphite layer 313 may include graphite molecules. The graphite molecules have a plate structure in which carbon atoms are connected to each other in a horizontal direction. Heat conductivity in the horizontal direction of the graphite layer 313 may be higher than heat conductivity in a vertical direction of the graphite layer 313, such that the graphite layer 313 may have superior heat discharge properties.

The protective layer 315 may be disposed to face the heat discharge adhesive layer 311 such that the graphite layer 313 is disposed between the protective layer 315 and the heat discharge adhesive layer 311. The protective layer 315 may prevent the graphite molecules of the graphite layer 313 from scattering. The protective layer 315 may include polyethylene terephthalate (PET).

The blocking layer 317 may be disposed on the buffering member 340. The blocking layer 317 may surround the heat discharge adhesive layer 311, the graphite layer 313, and the protective layer 315 when viewed in a plan view. The blocking layer 317, in cooperation with the heat discharge adhesive layer 311 and the protective layer 315, may seal the graphite layer 313. The blocking layer 317 may include polyethylene terephthalate (PET), as an example.

The emission member 320 may overlap the graphite layer 313 and may not overlap the blocking layer 317. A width W1 in the first direction DR1 of the emission member 320 may be substantially the same as a width W2 in the first direction DR1 of the graphite layer 313.

The emission member 320 may include a first emission adhesive layer 321, a conductive sheet 323, and a second emission adhesive layer 325.

The first emission adhesive layer 321 may be disposed between the heat discharge member 310 and the conductive sheet 323 to attach the heat discharge member 310 to the conductive sheet 323. The first emission adhesive layer 321 may include an optical clear adhesive (OCA) or an optical clear resin (OCR).

The conductive sheet 323 may include copper, nickel, ferrite, etc., as examples. The conductive sheet 323 may include suitable materials having superior heat conductivity and ability to block electro-magnetic interference (EMI).

The second emission adhesive layer 325 may be disposed between the conductive sheet 323 and the bracket 500 to attach the conductive sheet 323 to the bracket 500. The second emission adhesive layer 325 may include a conductive material to electrically connect the conductive sheet 323 to the bracket 500. The second emission adhesive layer 325 may include an optical clear adhesive (OCA) or an optical clear resin (OCR).

The reinforcing member 400 may be disposed to overlap with the blocking layer 317. One surface 401 of the reinforcing member 400 may have an adhesive property and may be adhered to the blocking layer 317. The other surface 403 of the reinforcing member 400 may not have the adhesive property, such that even if the reinforcing member 400 makes contact with the bracket 500, the other surface 403 of the reinforcing member 400 may not be adhered to the bracket 500.

The emission member 320 may have a first thickness T1 in the third direction DR3, and the reinforcing member 400 may have a second thickness T2 smaller than the first thickness T1 in the third direction DR3. The emission member 320 may contact the bracket 500, and the reinforcing member 400 may be spaced apart from the bracket 500. The reinforcing member 400 may be disposed on the same layer as the emission member 320 and may have a thickness smaller than that of the reinforcing member 320. The second emission adhesive layer 325 of the emission member 320 may be strongly attached to the bracket 500. As described above, when the adhesive force between the second emission adhesive layer 325 and the bracket 500 is sufficient, a pop-up phenomenon, in which the window member 100 is ejected out from the display apparatus 1000 due to a drop impact generated when the display apparatus 1000 is dropped, may be prevented. The display apparatus 1000 according to the present exemplary embodiment may include the reinforcing member 400, and thus durability of the display apparatus 1000 may be improved.

The reinforcing member 400 may cover the sealing member 240 when viewed in a plan view. The reinforcing member 400 may absorb a portion of the impacts applied to the sealing member 240 when the display apparatus 1000 is dropped, and the sealing member 240 may be prevented from being damaged. The impact resistance of the display apparatus 1000 including the reinforcing member 400 may be improved.

The reinforcing member 400 may be spaced apart from the emission member 320.

The reinforcing member 400 may be formed of a polymer resin, e.g., polyurethane, polycarbonate, polypropylene, polyethylene, etc., or formed from a rubber solution, a urethane-based material, or a sponge obtained by foaming/molding an acrylic-based material, as examples. For example, the reinforcing member 400 may include polyethylene terephthalate (PET).

Figure 5:
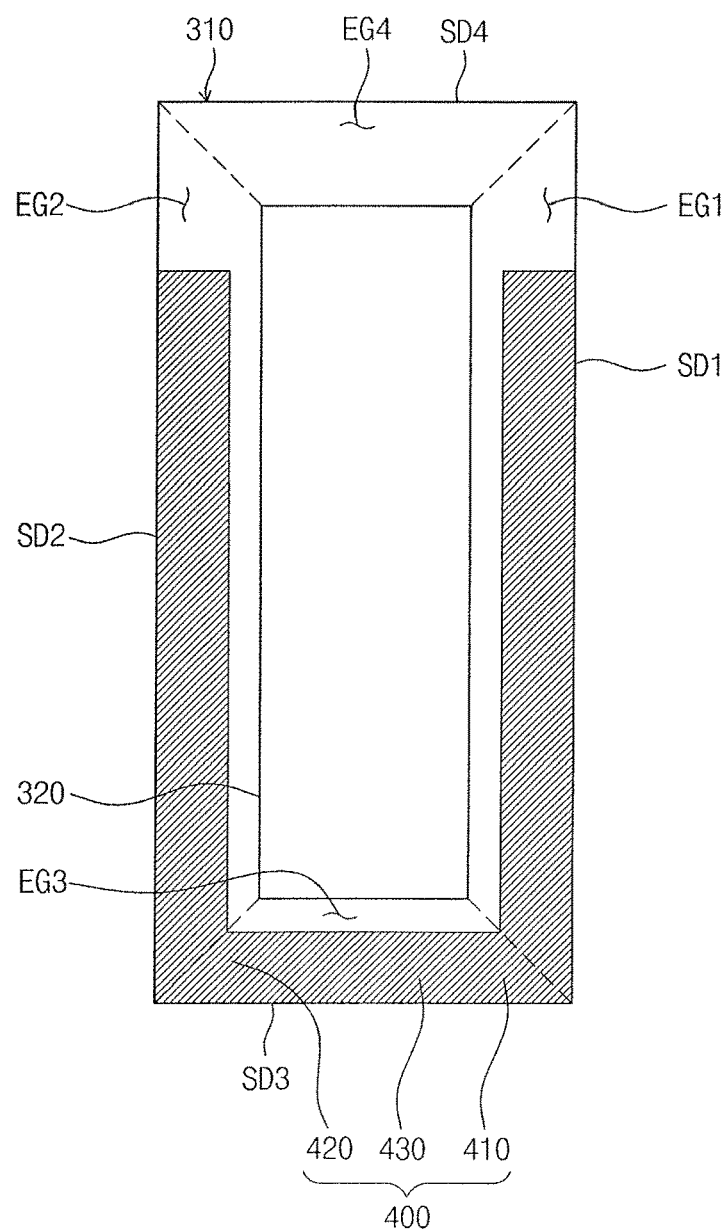
FIG. 5 illustrates a plan view showing the cover panel and a reinforcing member shown in FIG. 3.

FIG. 5 is a plan view showing the cover panel 300 and the reinforcing member 400 shown in FIG. 3.

Referring to FIGS. 3 and 5, the heat discharge member 310 may have a quadrangular shape. The heat discharge member 310 may include first, second, third, and fourth sides SD1, SD2, SD3, and SD4. The first and second sides SD1 and SD2 may be substantially parallel to each other and face each other. The third and fourth sides SD3 and SD4 are substantially parallel to each other and face each other.

The edge area of the heat discharge member 310 may include first, second, third, and fourth edge areas EG1, EG2, EG3, and EG4. The first to fourth edge areas EG1 to EG4 may extend along the first to fourth sides SD1 to SD4, respectively.

The reinforcing member 400 may be disposed to overlap with three edge areas of the first to fourth edge areas EG1 to EG4. The reinforcing member 400 may include first, second, and third reinforcing members 410, 420, and 430. The first reinforcing member 410 may be disposed to overlap with the first edge area EG1, the second reinforcing member 420 may be disposed to overlap with the second edge area EG2, and the third reinforcing member 430 may be disposed to overlap with the third edge area EG3. The first to third reinforcing members 410 to 430 may be integrally formed with each other. In FIGS. 3 and 5, the reinforcing member 400 may be formed along three sides of the heat discharge member 310, as examples. In some implementations, the reinforcing member 400 may be formed along four sides of the heat discharge member 310.

Figure 6:
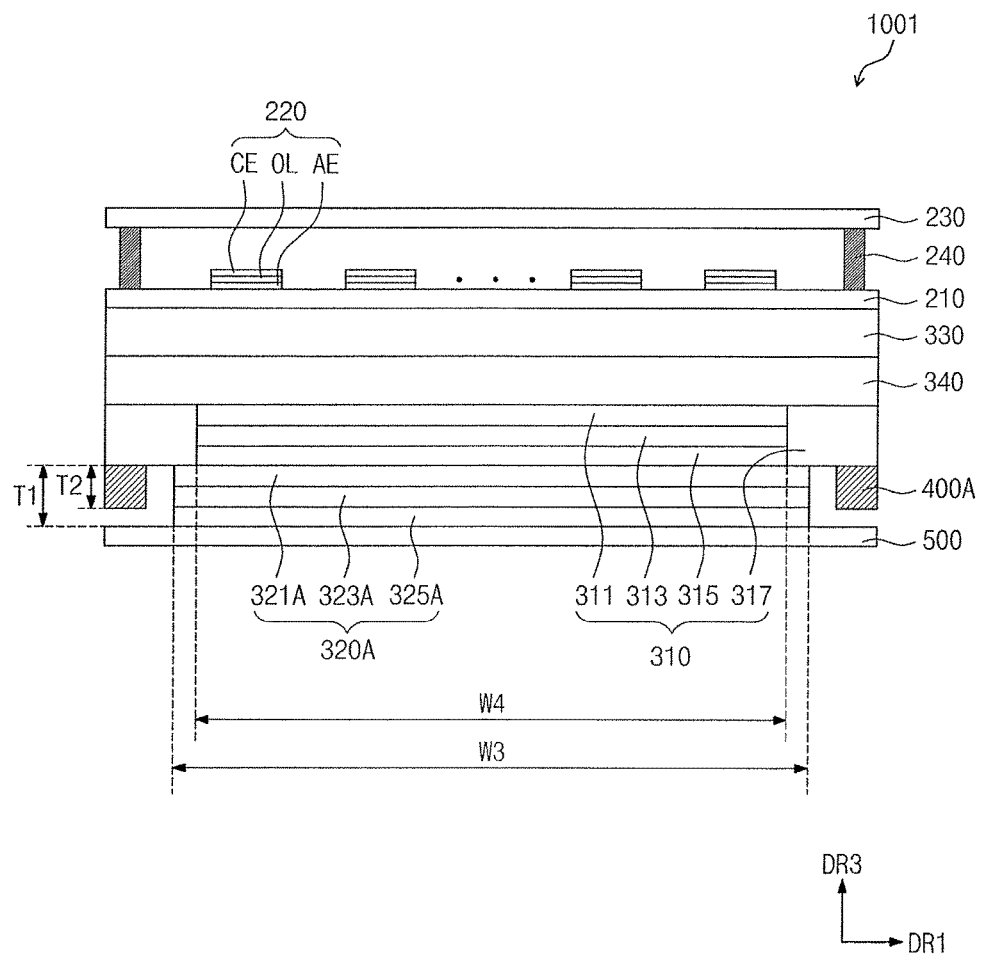
FIG. 6 illustrates a cross-sectional view showing a display apparatus according to an exemplary embodiment of the present disclosure.

FIG. 6 illustrates a cross-sectional view showing a display apparatus 1001 according to an exemplary embodiment.

The display apparatus 1001 shown in FIG. 6 may have the same structure and function as the display apparatus 1000 shown in FIGS. 1 to 5 except for the structure of the emission member 320A and a reinforcing member 400A.

The emission member 320A may be overlapped with the graphite layer 313 and a portion of the blocking layer 317. A width W3 in the first direction DR1 of the reinforcing member 320A may be greater than a width W4 in the first direction DR1 of the graphite layer 313.

The emission member 320A may include an emission adhesive layer 312A, a conductive sheet 323A, and a conductive adhesive layer 325A. The emission adhesive layer 312A, the conductive sheet 323A, and the conductive adhesive layer 325A may have the same width W3 in the first direction DR1.

In this embodiment, the emission adhesive layer 312A, the conductive sheet 323A, and the conductive adhesive layer 325A may include the same material as the first emission adhesive layer 321, the conductive sheet 323, and the conductive adhesive layer 325 described with reference to FIG. 4, and thus detailed descriptions of the emission adhesive layer 312A, the conductive sheet 323A, and the conductive adhesive layer 325A will not be repeated.

The reinforcing member 400A may be disposed to overlap with the blocking layer 317. The reinforcing member 400A may not be adhered to the bracket 500. The reinforcing member 400A may have a thickness smaller than that of the emission member 320 in the third direction DR3. The reinforcing member 400A may be spaced apart from the emission member 320. The reinforcing member 400A may cover the sealing member 240. The reinforcing member 400A may be formed of a polymer resin, e.g., polyurethane, polycarbonate, polypropylene, polyethylene, etc., or formed from a rubber solution, a urethane-based material, or a sponge obtained by foaming/molding an acrylic-based material, as examples. For example, the reinforcing member 400A may include polyethylene terephthalate (PET)

Figure 7:
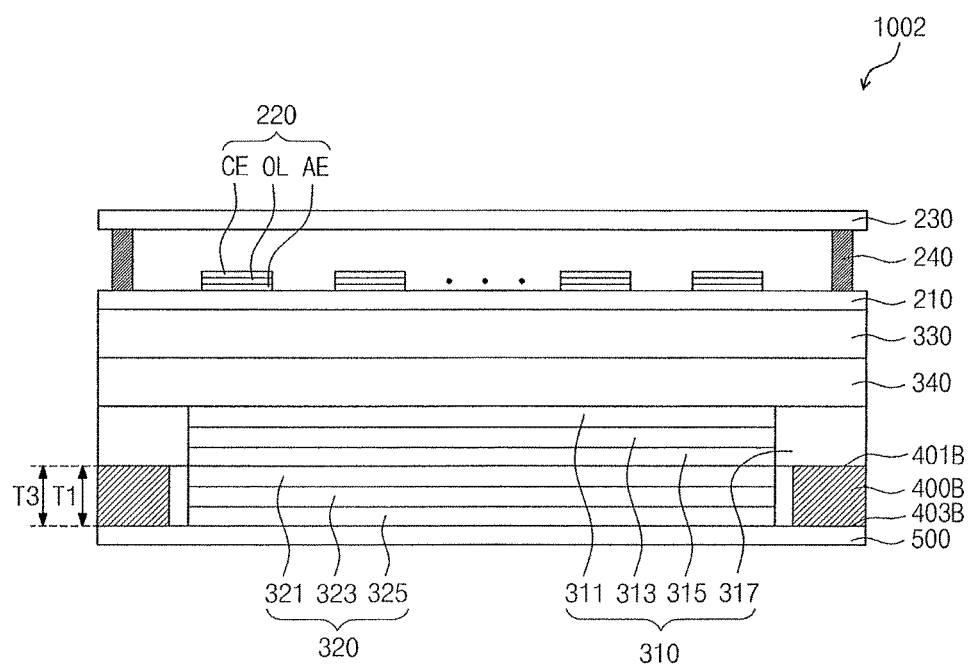
FIG. 7 illustrates a cross-sectional view showing a display apparatus according to an exemplary embodiment of the present disclosure.

FIG. 7 is a cross-sectional view showing a display apparatus 1002 according to an exemplary embodiment.

The display apparatus 1002 shown in FIG. 7 may have the same structure and function as the display apparatus 1000 shown in FIGS. 1 to 5 except for the structure of the reinforcing member 400B.

The emission member 320 may have a first thickness T1 in the third direction DR3 and the reinforcing member 400B may have a third thickness T3 equal to the first thickness T1 in the third direction DR3. Accordingly, the emission member 320 and the reinforcing member 400B may contact the bracket 500.

One surface 401B of the reinforcing member 400B may have an adhesive property and may be adhered to the blocking layer 317. The other surface 403B of the reinforcing member 400B may not have the adhesive property. Thus, although the reinforcing member 400B makes contact with the bracket 500, the other surface 403B of the reinforcing member 400B is not adhered to the bracket 500.

The reinforcing member 400B may be disposed to overlap with the blocking layer 317. The reinforcing member 400B may be disposed on the same layer as the emission member 320. The reinforcing member 400B may be spaced apart from the emission member 320. The reinforcing member 400B may overlap with the sealing member 240. The reinforcing member 400B may be formed of a polymer resin, e.g., polyurethane, polycarbonate, polypropylene, polyethylene, etc., or formed from a rubber solution, a urethane-based material, or a sponge obtained by foaming/molding an acrylic-based material, as examples. For example, the reinforcing member 400B may include polyethylene terephthalate (PET)

By way of summation and review, a display panel and window member may be vulnerable to external impacts. A portable terminal may be damaged due to such impacts when the portable terminal is dropped.

Embodiments provide a display apparatus having improved durability and high impact resistance. Embodiments provide a portable terminal having improved durability and high impact resistance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display apparatus, comprising:
   a display panel configured to display an image
   a first member under the display panel, the first member including a center portion and an edge portion surrounding the center portion, the center portion having a thickness greater than a thickness of the edge portion, the thickness of the center portion and the thickness of the edge portion being in a direction perpendicular to the display panel; and
   a second member under the first member and overlapping with the edge portion.

2. The display apparatus as claimed in claim 1, wherein the first member includes:
   a heat discharge member under the display panel; and
   an emission member under the heat discharge member, the emission member exposing an edge area of the heat discharge member when viewed in a plan view.

3. The display apparatus as claimed in claim 2, wherein the second member is on a same layer as the emission member and covers a portion of the edge area of the heat discharge member.

4. A display apparatus, comprising:
   a display panel configured to display an image;
   a first member under the display panel, the first member including a heat discharge member under the display panel and an emission member under the heat discharge member, the emission member exposing an edge area of the heat discharge member when viewed in a plan view, and including a center portion and an edge portion surrounding the center portion, the center portion having a thickness greater than a thickness of the edge portion; and
   a second member under the first member and overlapping with the edge portion, wherein the emission member has a first thickness and the second member has a second thickness smaller than the first thickness.

5. The display apparatus as claimed in claim 2, further comprising a bracket coupled to the emission member.

6. The display apparatus as claimed in claim 5, wherein the second member is not adhered to the bracket.

7. The display apparatus as claimed in claim 5, wherein the second member is spaced apart from the bracket.

8. The display apparatus as claimed in claim 2, wherein:
the heat discharge member has a substantially quadrangular shape,
the edge area of the heat discharge member includes first, second, third, and fourth edge areas extending respectively along four sides of the heat discharge member, and
the second member is in an overlapping relationship with three edge areas of the first to fourth edge areas.

9. The display apparatus as claimed in claim 2, wherein the first member further includes:
a light blocking member under the display panel; and
a buffering member between the light blocking member and the heat discharge member.

10. The display apparatus as claimed in claim 9, wherein the heat discharge member includes:
a graphite layer;
a heat discharge adhesive layer between the buffering member and the graphite layer, the heat discharge adhesive layer attaching the buffering member to the graphite layer;
a protective layer that faces the heat discharge adhesive layer such that the graphite layer is between the heat discharge adhesive layer and the protective layer; and
a blocking layer surrounding the heat discharge adhesive layer, the graphite layer, and the protective layer when viewed in a plan view, the blocking layer sealing the graphite layer in cooperation with the heat discharge adhesive layer and the protective layer.

11. The display apparatus as claimed in claim 10, wherein the emission member is in an overlapping relationship with the graphite layer and is not in an overlapping relationship with the blocking layer.

12. The display apparatus as claimed in claim 10, wherein the emission member is in an overlapping relationship with a portion of the graphite layer and the blocking layer.

13. The display apparatus as claimed in claim 2, wherein the emission member includes:
a conductive sheet;
a first emission adhesive layer between the heat discharge member and the conductive sheet, the first emission adhesive layer attaching the heat discharge member to the conductive sheet; and
a second emission adhesive layer between the conductive sheet and the bracket, the second emission adhesive layer attaching the conductive sheet to the bracket.

14. The display apparatus as claimed in claim 2, wherein the second member has a same thickness as the emission member.

15. The display apparatus as claimed in claim 1, wherein the second member includes polyethylene terephthalate.

16. A display apparatus, comprising:
a display panel configured to display an image;
a first member under the display panel, the first member including a center portion and an edge portion surrounding the center portion, the center portion having a thickness greater than a thickness of the edge portion; and
a second member under the first member and overlapping with the edge portion, wherein one surface of the second member has an adhesive property and is adhered to the first member and the other surface of the second member not have an adhesive property.

17. A display apparatus, comprising:
a display panel configured to display an image;
a first member under the display panel;
a second member under the first member, the second member exposing an edge area of the first member when viewed in a plan view;
a third member on a same layer as the second member, the third member overlapping a portion of the edge area of the first member.

18. The display apparatus as claimed in claim 17, wherein the third member includes polyethylene terephthalate.

19. The display apparatus as claimed in claim 17, wherein the second member has a first thickness and the third member has a second thickness smaller than the first thickness.

20. The display apparatus as claimed in claim 17, wherein the display apparatus further includes:
a light blocking member under the display panel; and
a buffering member between the light blocking member and the first member.

21. A display apparatus, comprising:
a display panel configured to display an image;
a first member under the display panel, the first member including a center portion and an edge portion surrounding the center portion, the center portion having a thickness greater than a thickness of the edge portion; and
a second member under the first member and overlapping with the edge portion, wherein one surface of the second member has an adhesive property and is adhered to the first member.

22. The display apparatus as claimed in claim 21, wherein the first member includes:
a heat discharge member under the display panel; and
an emission member under the heat discharge member, the emission member exposing an edge area of the heat discharge member when viewed in a plan view.

* * * * *